(12) United States Patent
Deak et al.

(10) Patent No.: US 10,393,828 B2
(45) Date of Patent: Aug. 27, 2019

(54) INTERDIGITATED Y-AXIS MAGNETORESISTIVE SENSOR

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 0 days.

(21) Appl. No.: 15/580,944

(22) PCT Filed: Jun. 1, 2016

(86) PCT No.: PCT/CN2016/084255
§ 371 (c)(1),
(2) Date: Dec. 8, 2017

(87) PCT Pub. No.: WO2016/197841
PCT Pub. Date: Dec. 15, 2016

(65) Prior Publication Data
US 2018/0164386 A1   Jun. 14, 2018

(30) Foreign Application Priority Data

Jun. 9, 2015 (CN) .......................... 2015 1 0312243

(51) Int. Cl.
*B82Y 25/00* (2011.01)
*G01R 33/09* (2006.01)
*H01L 43/08* (2006.01)

(52) U.S. Cl.
CPC ........... *G01R 33/093* (2013.01); *G01R 33/09* (2013.01); *G01R 33/096* (2013.01); *H01L 43/08* (2013.01); *B82Y 25/00* (2013.01)

(58) Field of Classification Search
CPC .... G01R 33/09; G01R 33/093; G01R 33/096; H01L 43/08
(Continued)

(56) References Cited

U.S. PATENT DOCUMENTS

2014/0266185 A1*  9/2014  Sidman ................ G01R 33/093
                                                          324/252

FOREIGN PATENT DOCUMENTS

| CN | 103901363 | 7/2014 |
| CN | 104280700 | 1/2015 |

(Continued)

OTHER PUBLICATIONS

"International Application No. PCT/CN2016/084255, International Search Report and Written Opinion dated Aug. 29, 2016", (dated Aug. 29, 2016), 10 pgs.

*Primary Examiner* — Melissa J Koval
*Assistant Examiner* — Rahul Maini
(74) *Attorney, Agent, or Firm* — Schwegman Lundberg & Woessner, P.A.

(57) ABSTRACT

An interdigitated Y-axis magnetoresistive sensor, comprising a substrate, and located on the substrate is a first comb-shaped soft ferromagnetic flux guide, a second comb-shaped soft ferromagnetic flux guide, and a push-pull magnetoresistive bridge sensing unit. It also may include a calibration and/or an initialization coil. The first and the second comb-shaped soft ferromagnetic flux guides are formed into an interdigitated shape. The gaps between a second comb tooth and two adjacent the first comb teeth are the first gap and the second gap. Furthermore, a pair of gaps are formed between the second come tooth and the base of the first comb as well as between the first comb tooth and the second comb tooth base. A push magnetoresistive unit string and a pull magnetoresistive unit string are alternately placed (Continued)

in the first gap and the second gap, respectively. The resulting magnetoresistive sensing unit senses the magnetic field along the X-axis. The calibration coil comprises straight calibration conductors that are parallel to the magnetoresistive sensing unit string. The initialization coil is comprised of straight initialization conductors that are perpendicular to the magnetoresistive sensing unit string. As a result of the interdigitated soft ferromagnetic flux guides, Y-axis magnetic field measurement is enabled. The present design is easy to implement, has high-gain, and low power consumption.

30 Claims, 18 Drawing Sheets

(58) Field of Classification Search
USPC .................................................. 324/207.21
See application file for complete search history.

(56) References Cited

FOREIGN PATENT DOCUMENTS

| | | |
|---|---|---|
| CN | 104880682 | 9/2015 |
| CN | 204740335 | 11/2015 |
| JP | 2000321014 | 11/2000 |
| WO | WO-2015107949 | 7/2015 |
| WO | WO-2016197841 | 12/2016 |

* cited by examiner

INTERDIGITATED Y-AXIS MAGNETORESISTIVE SENSOR

PRIORITY CLAIM TO RELATED APPLICATIONS

This application is a U.S. national stage application filed under 35 U.S.C. § 371 from International Application Serial No. PCT/CN2016/084255, which was filed 1 Jun. 2016, and published as WO2016/197841 on 15 Dec. 2016, and which claims priority to China Application No. 201510312243.3, filed 9 Jun. 2015, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to an interdigitated Y-axis magnetoresistive sensor.

BACKGROUND ART

During the design of two-axis and three-axis magnetic compass chips, both X-axis and Y-axis magnetic field sensors are required. Sensing units of a magnetoresistive type generally have a single magnetic field sensing direction. For example, consider sensing units that are sensitive to X-direction magnetic fields. In order to detect Y-direction magnetic fields, Y-direction magnetic field sensing units are obtained generally by rotating X-direction magnetic field sensing units by 90 degrees. Next, to improve magnetic field sensitivity of an X- or Y-axis magnetoresistive sensor, a push-pull bridge is generally employed, where a push arm and a pull arm are manufactured discretely, that is, one arm is rotated 180 degrees with respect to the other arm, and then push arm dice and the pull arm dice are connected using wire-bonding.

The Y-axis magnetoresistive sensor described above has the following problems:

1) When X- and Y-axis magnetoresistive sensors are required to be manufactured at the same time in the same plane, because the X- and Y-axis magnetoresistive sensors are discrete devices, integrated manufacturing cannot be realized, thereby increasing the process complexity and affecting measurement accuracy of two-axis or three-axis sensors.

2) A push arm and a pull arm cannot be manufactured using an integrated process, and the discrete chips must be connected with wire-bonds which is a process that also increases the process complexity and affects the measurement accuracy of the sensors.

SUMMARY OF THE INVENTION

In order to solve the foregoing existing problems, the present invention proposes an interdigitated Y-axis magnetoresistive sensor, wherein a magnetic circuit composed of interdigitated soft ferromagnetic flux concentrators, and produces a conversion of a Y magnetic field into −X and X-direction magnetic field components which respectively act upon a push magnetoresistive sensing unit and a pull magnetoresistive sensing unit to realize enhanced output of Y magnetic field signals. In this scheme, when an X magnetic field is present, the X-direction magnetic field components which act upon the push magnetoresistive sensing unit and the pull magnetoresistive sensing unit cancel out producing zero output.

The interdigitated Y-axis magnetoresistive sensor according to the present invention includes a substrate, and a first comb-shaped soft ferromagnetic flux guide, a second comb-shaped soft ferromagnetic flux guide, and a push-pull magnetoresistive bridge sensing unit located on the substrate;

a first comb tooth and a first comb base of the first comb-shaped soft ferromagnetic flux guide and a second comb tooth and a second comb base of the second comb-shaped soft ferromagnetic flux guide are all rectangular, major axes and minor axes of the first comb tooth and the second comb tooth are parallel to the Y axis and the X axis, respectively, and major axes and minor axes of the first comb base and the second comb base are parallel to the X axis and the Y axis, respectively;

the first comb-shaped soft ferromagnetic flux guide and the second comb-shaped soft ferromagnetic flux guide are formed into an interdigitated structure, a first gap and a second gap are alternately formed in sequence between the first comb tooth and the second comb tooth which are adjacent, and gaps are also formed between the second comb tooth and the first comb base as well as between the first comb tooth and the second comb base; and the push-pull magnetoresistive bridge sensing unit includes push and pull magnetoresistive sensing unit strings, the push and pull magnetoresistive sensing unit strings both include multiple magnetoresistive sensing units connected in series and/or connected in parallel, are parallel to the Y-axis, and are alternately placed in the first gap and the second gap, the push and pull magnetoresistive sensing unit strings are electrically connected to form a push arm and a pull arm, respectively, the push arm and the pull arm include the same number of the magnetoresistive sensing unit strings, the push arm and the pull arm are electrically connected to form the push-pull magnetoresistive bridge sensing unit, and the magnetoresistive sensing unit senses the magnetic field along the X-axis.

The interdigitated Y-axis magnetoresistive sensor further includes a calibration coil and/or an initialization coil, wherein the calibration coil includes straight calibration conductors that are parallel to the push and pull magnetoresistive sensing unit strings, and when a calibration current flows through the calibration coil, calibration magnetic field components having the same amplitude along X and −X directions are generated at the push and pull magnetoresistive sensing unit strings, respectively; the initialization coil includes straight initialization conductors that are perpendicular to the push and pull magnetoresistive sensing unit strings, and when an initialization current flows into the initialization coil, magnetic field components having the same amplitude along a Y direction or a −Y direction are generated at all the magnetoresistive sensing units.

All the first comb teeth are of the same size, all the second comb teeth are of the same size, all the first gaps are of the same size, all the second gaps are of the same size, and the sizes of the first gaps and the second gaps are the same.

The magnetoresistive sensing units are GMR spin valves or TMR sensing units, wherein the directions of pinning layers are parallel to the Y-axis, and the directions of free layers are parallel to the X-axis.

In the absence of an external magnetic field, the magnetoresistive sensing units make magnetization directions of magnetic free layers perpendicular to magnetization directions of magnetic pinning layers by permanent magnet biasing, double exchange interaction, shape anisotropy or any combination thereof.

The push-pull magnetoresistive bridge sensing unit is a half bridge, a full bridge, or a quasi bridge.

When the number of the first comb teeth is 2*N+1, N being an integer greater than 1, the push magnetoresistive sensing unit string and the pull magnetoresistive sensing unit string are alternately distributed in 2*N first gaps and second gaps.

When the number of the first comb teeth is 2*N+2, N being an integer greater than 1, the push magnetoresistive sensing unit string and the pull magnetoresistive sensing unit string are alternately distributed in 2*N first gaps and second gaps except the first gap and the second gap which are located in the middle.

When the number of the first comb teeth is 2, the push magnetoresistive sensing unit string and the pull magnetoresistive sensing unit string are alternately distributed in the first gap and the second gap.

Any of the push magnetoresistive sensing unit string has a pull magnetoresistive sensing unit string symmetric therewith relative to the X-axis centerline of the first comb-shaped soft ferromagnetic flux concentrator.

With the increase of a ratio (Lx10+Lx20)/gapy of the sum of the width Lx10 of the first comb tooth and the width Lx20 of the second comb tooth with respect to the widths gapy of the first gap and the second gap, the gain of the push-pull magnetoresistive bridge sensing unit is increased.

X ends and −X ends of the first comb base and the second comb base are all aligned.

The Y-axis magnetoresistive sensor further includes two identical soft ferromagnetic flux concentrator bars, and the two soft ferromagnetic flux concentrator bars are located at an X end and a −X end of the first comb-shaped soft ferromagnetic flux concentrator and the second comb-shaped soft ferromagnetic flux concentrator respectively and are at the same distance from the two ends.

The calibration coil includes a push straight calibration conductor and a pull straight calibration conductor, a position relation between the push straight calibration conductor and the corresponding push magnetoresistive sensing unit string is the same as that between the pull straight calibration conductor and the corresponding pull magnetoresistive sensing unit string, the position relation is that the straight calibration conductor is located directly above or directly below the corresponding magnetoresistive sensing unit string, and the push straight calibration conductor and the pull straight calibration conductor are connected in series and have opposite current directions.

The calibration coil includes a push straight calibration conductor and a pull straight calibration conductor, the push straight calibration conductor and the pull straight calibration conductor both include two parallel straight calibration conductors connected in parallel, the two push straight calibration conductors and the two pull straight calibration conductors have the same spacing and are symmetrically distributed on two sides of the push and pull magnetoresistive sensing unit strings, respectively, and the push straight calibration conductors and the pull straight calibration conductors are connected in series and have opposite current directions.

The initialization coil is a planar coil, and the straight initialization conductors included therein are perpendicular to the push magnetoresistive sensing unit string and the pull magnetoresistive sensing unit string, are located directly above or directly below each magnetoresistive sensing unit, and have identical current directions.

The initialization coil is a three-dimensional coil, the three-dimensional coil winds the first comb-shaped soft ferromagnetic flux guide, the second comb-shaped soft ferromagnetic flux guide and the magnetoresistive sensing unit, the straight initialization conductors are located on the surfaces of the soft ferromagnetic flux guides and the magnetoresistive sensing unit, respectively, and the straight initialization conductors have the same arrangement interval on the surfaces.

The calibration coil includes a positive port and a negative port, and when a current flows through the two ports, a calibration magnetic field of known amplitude is generated that is within a linear working range of the magnetoresistive sensing unit.

The calibration current may be set to one current value or multiple current values.

The initialization coil includes two ports, and when a current flows through the two ports, an initialization magnetic field is generated with magnitude higher than the saturation magnetic field value of the magnetoresistive sensing unit.

The initialization current is a pulse current or a direct current.

The initialization coil and the calibration coil are made of a high-conductivity material, and the high-conductivity materials include Cu, Au, Ag, or Al.

The soft ferromagnetic flux concentrator is made of soft ferromagnetic alloy that includes one or more elements of Fe, Ni, and Co.

The material of the substrate is glass or a silicon wafer, and the substrate includes an ASIC or the substrate is connected to another ASIC chip.

The initialization coil and/or the calibration coil are/is located above the substrate and below the magnetoresistive sensing unit, or between the magnetoresistive sensing unit and the soft ferromagnetic flux guide, or above the soft ferromagnetic flux guide.

The initialization coil and/or the calibration coil are/is isolated from the first comb-shaped soft ferromagnetic flux guide, the second comb-shaped soft ferromagnetic flux guide, and the push-pull magnetoresistive bridge sensing unit by using an insulating material, and the insulating material is SiO2, Al2O3, Si3N4, polyimide or photoresist.

DETAILED DESCRIPTION

The present invention is described below in detail with reference to the accompanying drawings and embodiments.

Embodiment 1

Figure 1:
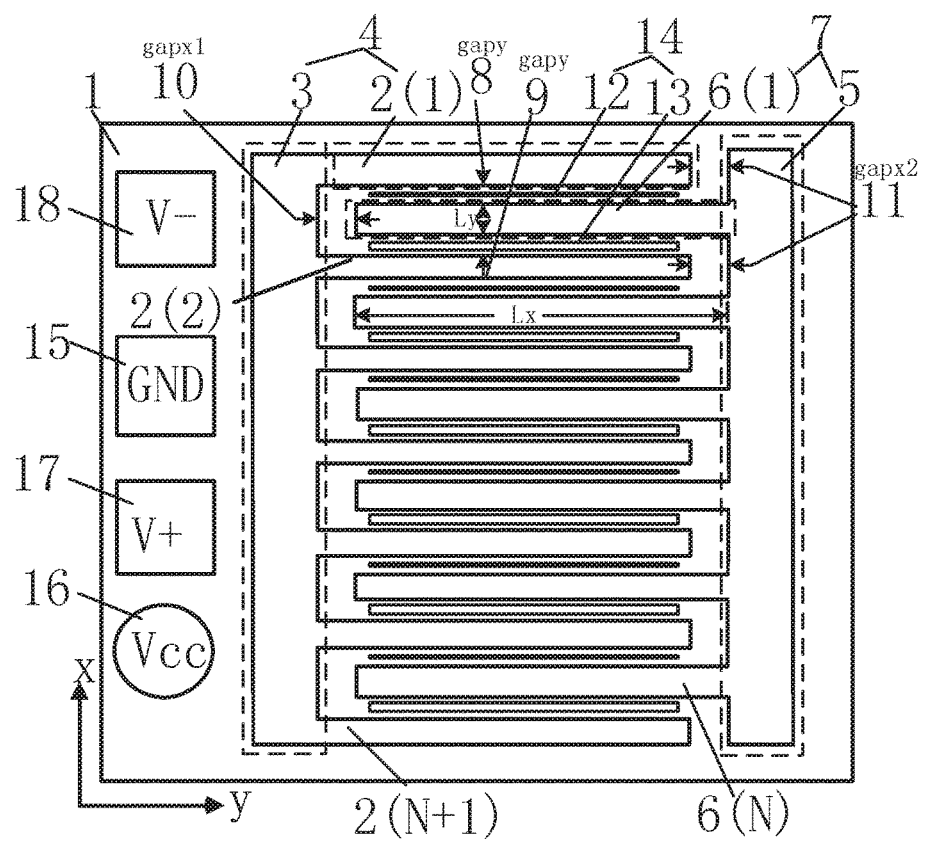
FIG. 1 is a basic structural diagram of an interdigitated Y-axis magnetoresistive sensor.

FIG. 1 is a basic structural diagram of an interdigitated Y-axis magnetoresistive sensor, including a substrate 1, and a first comb-shaped soft ferromagnetic flux guide 4, a second comb-shaped soft ferromagnetic flux guide 7, and a push-pull magnetoresistive bridge sensing unit 14 located on the substrate 1. The first comb-shaped soft ferromagnetic flux guide 4 includes N+1 first comb teeth 2(1), 2(2) . . . 2(N+1) and a first comb base 3. The first comb teeth are elongated, major axes thereof are parallel to the Y axis, and minor axes thereof are parallel to the X axis. The first comb teeth are of the same size and parallel to each other, and have the same spacing. −Y ends of the N+1 first comb teeth are aligned and are connected to the first comb base 3. The first comb base 3 is also elongated, a major axis thereof is parallel to the X axis, and a minor axis thereof is parallel to the Y axis. The second comb-shaped soft ferromagnetic flux guide 7 includes N second comb teeth 6(1), 6(2) . . . 6(N) and a second comb base 5. The second comb teeth are also elongated, major axes thereof are parallel to the Y axis, and minor axes thereof are parallel to the X axis. The second comb teeth are of the same size and parallel to each other, and have the same spacing. +Y ends of the N second comb teeth are aligned and are connected to the second comb base 5. The second comb base 5 is also elongated, a major axis thereof is parallel to the X axis, and a minor axis thereof is parallel to the Y axis.

The first comb-shaped soft ferromagnetic flux guide 4 and the second comb-shaped soft ferromagnetic flux guide 7 are formed into an interdigitated structure. A first gap 8 and a second gap 9 that have the same width gapy are alternately formed respectively between the second comb tooth, such as 6(1), and the two first comb teeth, such as 2(1) and 2(2), adjacent thereto. A third gap 10 and a fourth gap 11 that have lengths gapx1 and gapx2 are alternately formed respectively between the second comb tooth, such as 6(1), and the first comb base 3 as well as between the first comb teeth, such as 2(1) and 2(2), and the second comb base 5.

The push-pull magnetoresistive bridge sensing unit 14 includes at least one push arm and a pull arm. The push arm includes at least one push magnetoresistive sensing unit string 12. The pull arm includes at least one pull magnetoresistive sensing unit string 13. The magnetoresistive sensing unit string includes multiple magnetoresistive sensing units connected in series or connected in parallel. The push arm and the pull arm have the same number of magnetoresistive sensing unit strings. The push magnetoresistive sensing unit string and the pull magnetoresistive sensing unit string are all parallel to the Y-axis, and are alternately located in the first gap 8 and the second gap 9. The magnetoresistive sensing unit senses the magnetic field along the X-axis. 15, 16, 17, and 18 respectively correspond to a ground end, a power input end, and signal output ends of two half bridges of the push-pull magnetoresistive bridge sensing unit 14.

Embodiment 2

Figure 2:
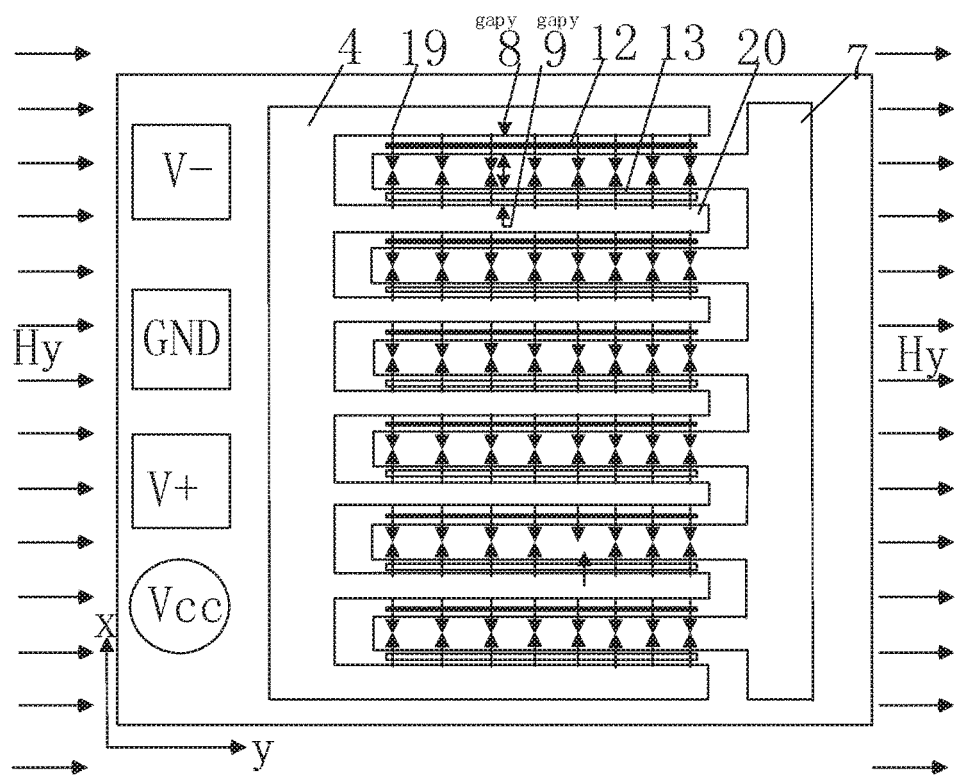
FIG. 2 is a schematic diagram of measurement of a Y magnetic field of an interdigitated Y-axis magnetoresistive sensor.
Figure 3:
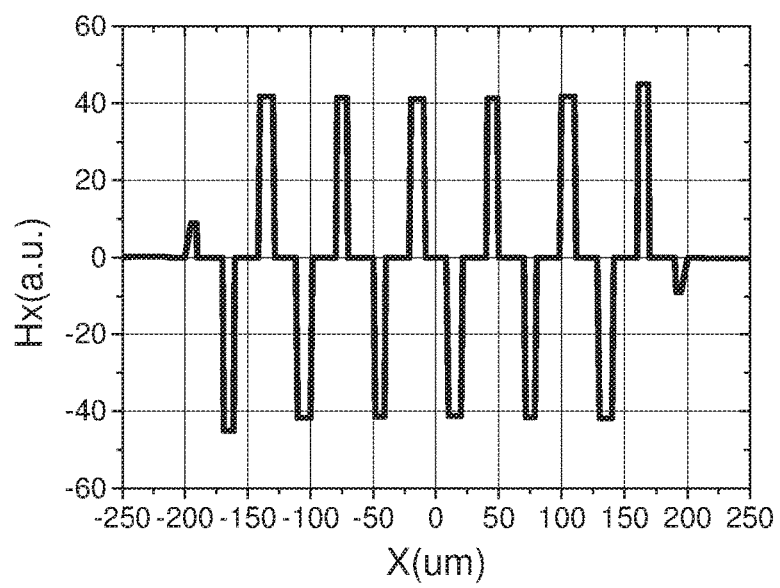
FIG. 3 is a distribution diagram of sensitive magnetic fields of push and pull magnetoresistive sensor unit strings of a Y magnetic field of an interdigitated Y-axis magnetoresistive sensor.

FIG. 2 is a schematic diagram of measurement of a Y magnetic field of an interdigitated Y-axis magnetoresistive sensor, from which it can be seen that, by use of an interdigitated structure formed by the first comb-shaped soft ferromagnetic flux guide 4 and the second comb-shaped soft ferromagnetic flux guide 7, magnetic field components 19 and 20 having −X and X directions are alternately formed at the first gap 8 and the second gap 9, which respectively act upon the push magnetoresistive sensing unit string 12 and the pull magnetoresistive sensing unit string 13. Distribution features of Hx magnetic fields thereof are as shown in FIG. 3, from which it can be seen that Hx magnetic fields at the first gap 8 and the second gap 9 are of the same size but in opposite directions.

Figure 4:
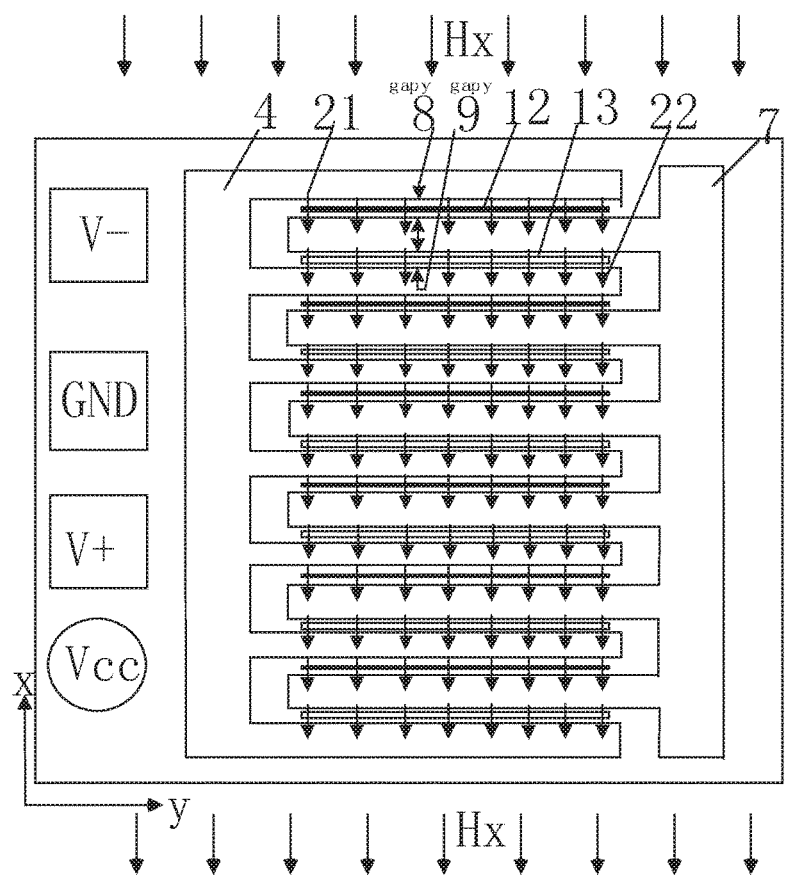
FIG. 4 is an X magnetic field measurement diagram of an interdigitated Y-axis magnetoresistive sensor.

FIG. 4 is a schematic diagram of measurement of an X magnetic field of an interdigitated Y-axis magnetoresistive sensor, from which it can be seen that, by use of an interdigitated structure formed by the first comb-shaped soft ferromagnetic flux guide 4 and the second comb-shaped soft ferromagnetic flux guide 7, magnetic field components 21 and 22 having a direction the same as that of an external X magnetic field are formed at the first gap 8 and the second gap 9, which respectively act upon the push magnetoresistive sensing unit string 12 and the pull magnetoresistive sensing unit string 13.

Figure 5:
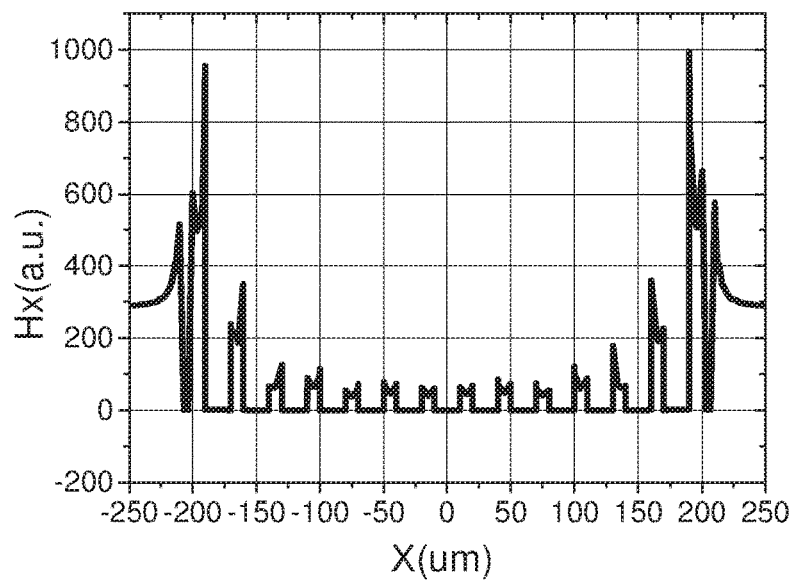
FIG. 5 is a distribution diagram of sensitive magnetic fields of push and pull magnetoresistive sensor unit strings of an X magnetic field of an interdigitated Y-axis magnetoresistive sensor.

FIG. 5 shows distribution of Hx magnetic fields at the first gap and the second gap, from which it can be seen that distribution of the Hx magnetic fields has a feature of symmetry relative to the center. This also puts forward a requirement on symmetry of the distribution of the push magnetoresistive sensing unit string and the pull magnetoresistive sensing unit string of the push-pull magnetoresistive sensing unit at the first gap and the second gap, that is, for a position of a first gap where any push magnetoresistive sensing unit string is located, there is definitely a corresponding pull magnetoresistive sensing unit string, and at the second gap where the pull magnetoresistive sensing unit string is located, there is the same Hx magnetic field component relative to the position of the first gap. Only in this way can a cancellation effect on the external X magnetic field be ensured.

Embodiment 3

Figure 6:
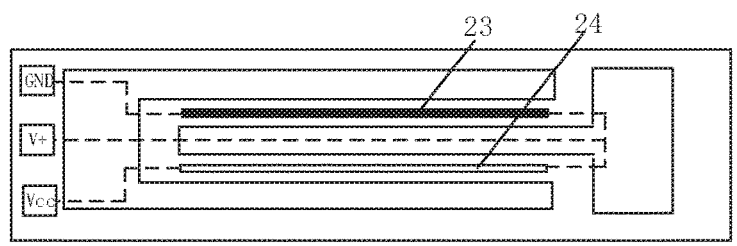
FIG. 6 is an electrical connection diagram of an interdigitated Y-axis magnetoresistive sensor when the number of first comb teeth is N=2.
Figure 7:
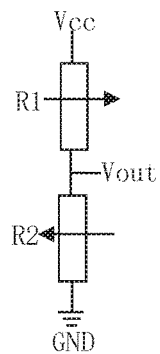
FIG. 7 is a half-bridge structural diagram of a push-pull magnetoresistive sensing unit when the number of first comb teeth is N=2.

FIG. 6 is a structural diagram of an interdigitated Y-axis magnetoresistive sensor when the number of comb teeth of the first comb-shaped soft ferromagnetic flux guide is N=2. The push-pull magnetoresistive bridge sensing unit includes a push magnetoresistive sensing unit string 23 located in the first gap and a pull magnetoresistive sensing unit string 24 located in the second gap. FIG. 7 shows a push-pull half-bridge structure formed by a push magnetoresistive sensing unit string and a pull magnetoresistive sensing unit string when N=2, including a push arm R1 and a pull arm R2.

Figure 8:
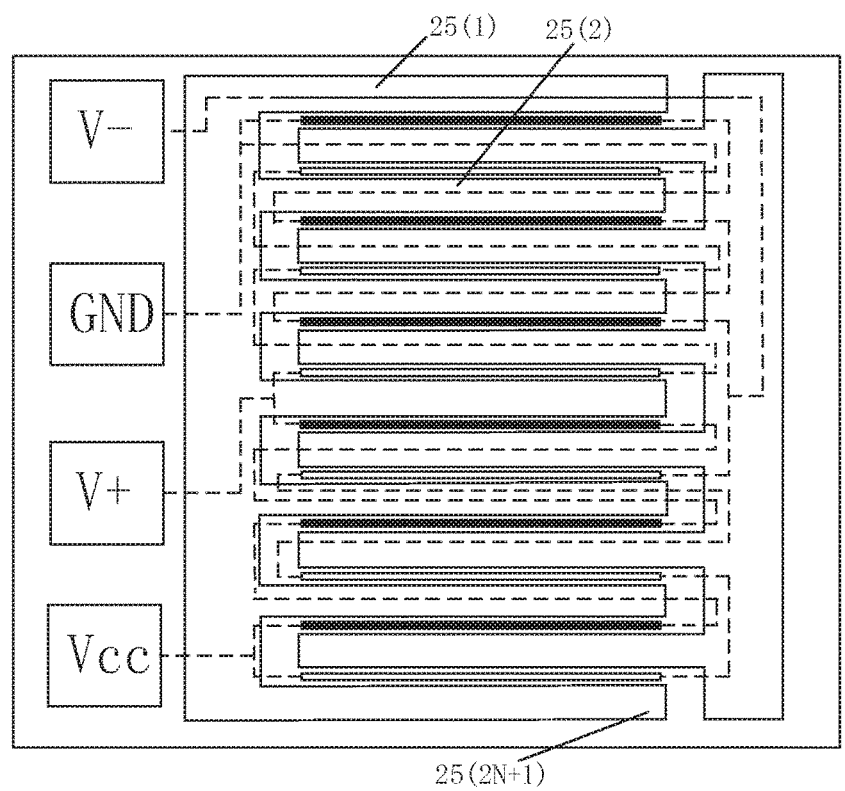
FIG. 8 is an electrical connection diagram of an interdigitated Y-axis magnetoresistive sensor when the number of first comb teeth is 2N+1.
Figure 9:
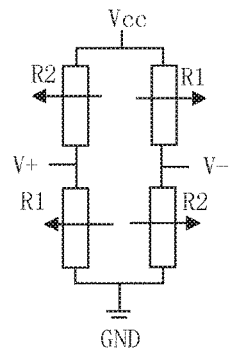
FIG. 9 is a full-bridge structural diagram of a push-pull magnetoresistive sensing unit.

FIG. 8 is a structural diagram of an interdigitated Y-axis magnetoresistive sensor when the number of comb teeth 25(1), 25(2) . . . 25(2N+1) of the first comb-shaped soft ferromagnetic flux guide is 2N+1. The number of the push magnetoresistive sensing unit strings and the pull magnetoresistive sensing unit strings alternately located in the first gaps and the second gaps is 4N, and in this case, the push magnetoresistive sensing unit strings and the pull magnetoresistive sensing unit strings are alternately located in all the first gaps and the second gaps. An electrical connection diagram thereof is as shown in FIG. 8, and a full-bridge push-pull structure formed is as shown in FIG. 9.

Figure 10:
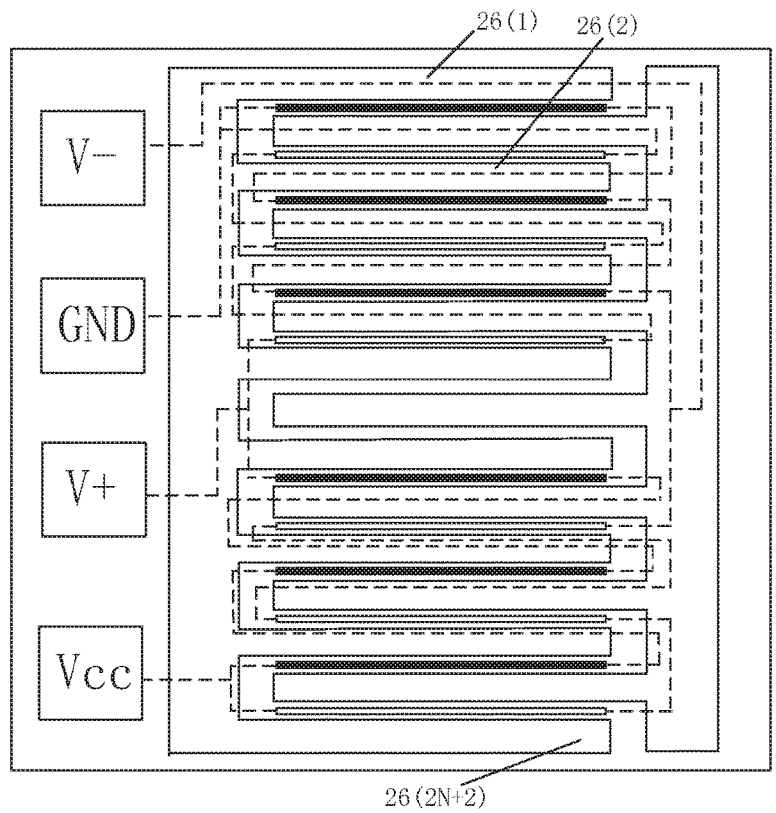
FIG. 10 is an electrical connection diagram of an interdigitated Y-axis magnetoresistive sensor when the number of first comb teeth is 2N+2.

FIG. 10 is a structural diagram of an interdigitated Y-axis magnetoresistive sensor when the number of comb teeth 26(1), 26(2) . . . 26(2N+2) of the first comb-shaped soft ferromagnetic flux guide is 2N+2. In this case, in order to make the number of the push magnetoresistive sensing unit strings and the pull magnetoresistive sensing unit strings alternately located in the first gaps and the second gaps be 4N, one push magnetoresistive sensing unit string and one pull magnetoresistive sensing unit string need to be reduced at the same time. Meanwhile, in consideration of the requirement on symmetry of the Hx magnetic field, it is required that if any push magnetoresistive sensing unit string is reduced, a pull magnetoresistive sensing unit string is reduced at the same time, and the push magnetoresistive sensing unit string and the pull magnetoresistive sensing unit string are symmetrical relative to a Y centerline.

The above merely provides a situation where the push magnetoresistive sensing unit strings and the pull magnetoresistive sensing unit strings are electrically connected to form a full bridge. In actual circumstances, the push magnetoresistive sensing unit strings and the pull magnetoresistive sensing unit strings may also be electrically connected to form a half-bridge or quasi-bridge structure.

Embodiment 4

Figure 11:
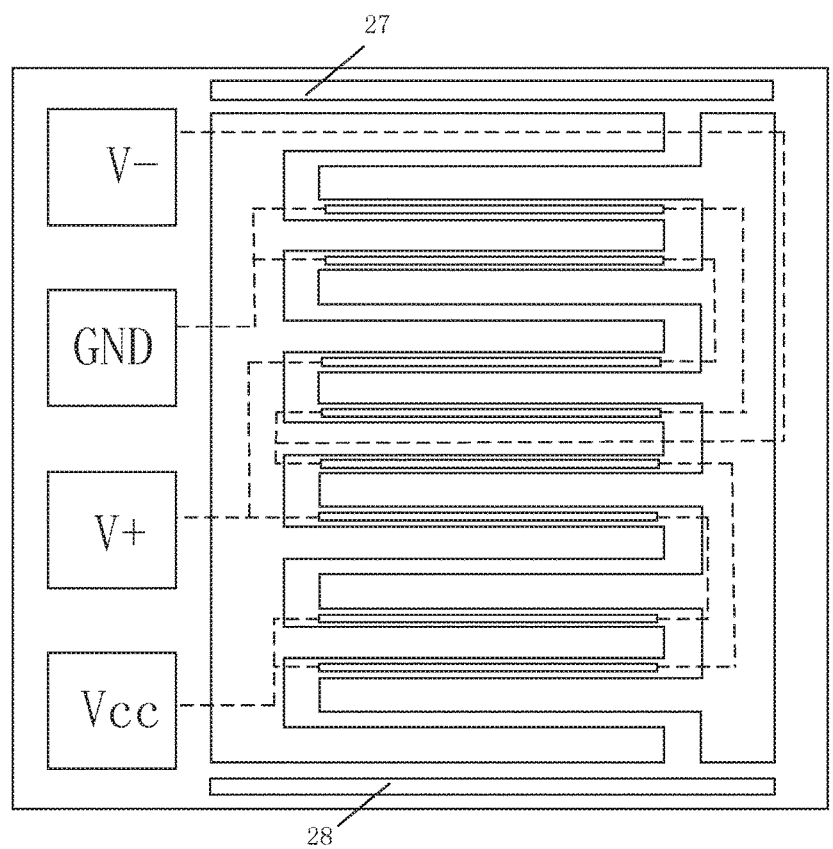
FIG. 11 is an electrical connection diagram of a Y-axis magnetoresistive sensor with straight bars at two ends.

FIG. 11 shows another form of an interdigitated Y-axis magnetoresistive sensor. In addition to the interdigitated structure formed by the first comb-shaped soft ferromagnetic flux guide and the second comb-shaped soft ferromagnetic flux guide, two elongated soft ferromagnetic flux guides 27 and 28 are further introduced at X and −X ends. The Y-direction lengths of the elongated soft ferromagnetic flux guides span from −Y ends to +Y ends of the interdigitated soft ferromagnetic flux guides, and the elongated soft ferromagnetic flux guides are aligned and are at the same distance from the −X and +X ends.

Embodiment 5

Figure 12:
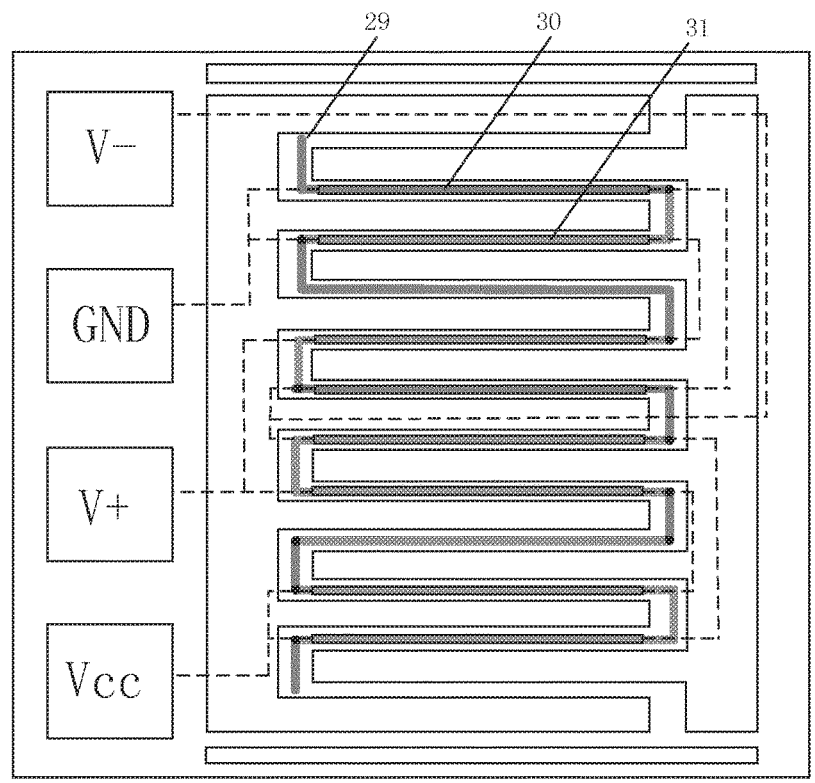
FIG. 12 is an electrical connection diagram of an interdigitated Y-axis magnetoresistive sensor including a calibration coil with a first structure.

FIG. 12 is a structural diagram of a calibration coil 29 of an interdigitated Y-axis magnetoresistive sensor. The calibration coil includes straight calibration conductors 30 and 31 that are parallel to the push magnetoresistive sensing unit string and the pull magnetoresistive sensing unit string. The straight calibration conductor 30 is located directly above or directly below the push magnetoresistive sensing unit string, and the straight calibration conductor 31 is located directly above or directly below the pull magnetoresistive sensing unit string, to become a push straight calibration conductor 30 and a pull straight calibration conductor 31 respectively, which have opposite current directions and are connected in series. It should be noted that, when the push straight calibration conductor 30 is located directly above (directly below) the push magnetoresistive sensing unit string, the pull straight calibration conductor 31 is also located directly above (directly below) the pull magnetoresistive sensing unit string.

Figure 13:
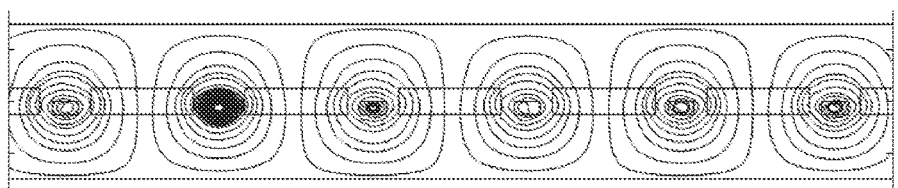
FIG. 13 is a distribution diagram of calibration direct current magnetic field lines generated by a calibration current of a calibration coil with a first structure.
Figure 14:
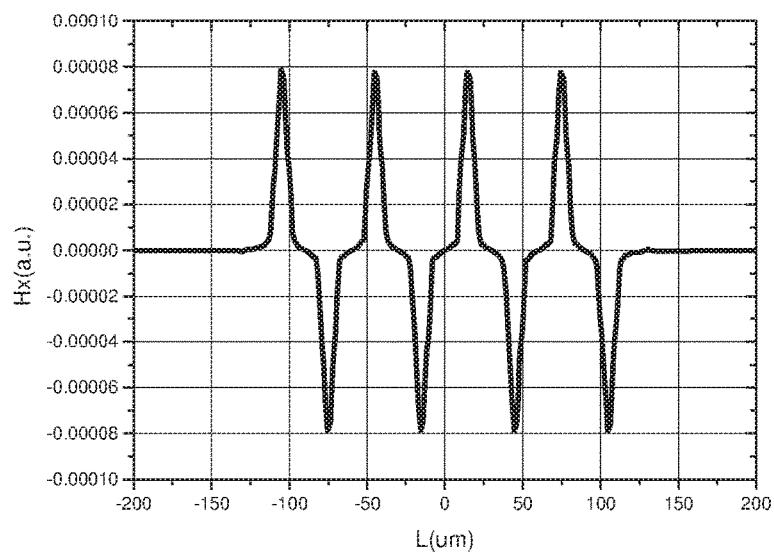
FIG. 14 is a distribution diagram of calibration magnetic field components of a calibration coil with a first structure at a magnetoresistive sensing unit string.

FIG. 13 shows distribution features of a magnetic field generated by the calibration coil 29 on the interdigitated Y-axis magnetoresistive sensor, from which it can be seen that the push straight calibration conductor and the pull straight calibration conductor generate opposite magnetic field distributions at the first gap and the second gap. FIG. 14 shows distribution of X-direction magnetic fields at the push magnetoresistive sensing unit string and the pull magnetoresistive sensing unit string, from which it can be seen that the push magnetoresistive sensing unit and the pull magnetoresistive sensing unit have opposite magnetic field distribution features, are of the same size but in opposite directions, and are in line with features of effects of a Y calibration magnetic field of the push-pull magnetoresistive bridge sensing unit.

Figure 15:
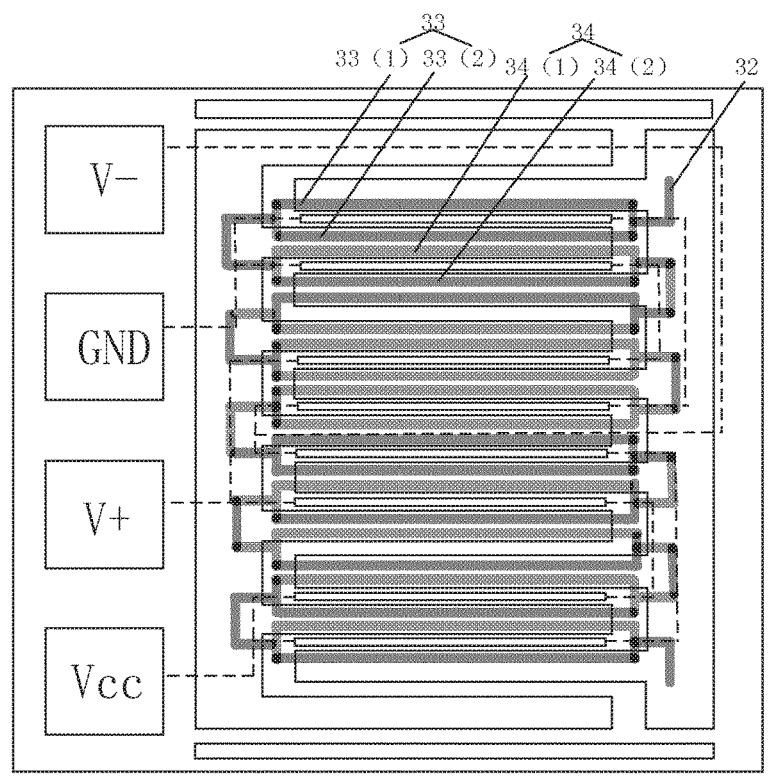
FIG. 15 is an electrical connection diagram of an interdigitated Y-axis magnetoresistive sensor including a calibration coil with a second structure.

FIG. 15 is a structural diagram of another type of calibration coil 32 on an interdigitated Y-axis magnetoresistive sensor. The calibration coil includes a push straight calibration conductor 33 and a pull straight calibration conductor 34. The push straight calibration conductor 33 includes two push straight calibration sub-conductors 33(1) and 33(2) connected in parallel, which are parallel to the push magnetoresistive sensing unit string respectively and are symmetrically located on two sides of the push magnetoresistive sensing unit string. The pull straight calibration conductor 34 includes two pull straight calibration sub-conductors 34(1) and 34(2) connected in parallel, which are parallel to the pull magnetoresistive sensing unit string respectively and are symmetrically located on two sides of the pull magnetoresistive sensing unit string. A distance between the two push straight calibration sub-conductors and a distance between the two pull straight calibration sub-conductors are the same. The push straight calibration conductor 33 and the pull straight calibration conductor 34 are connected in series, and have opposite current directions.

Figure 16:
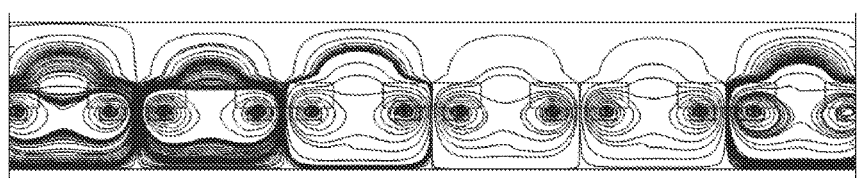
FIG. 16 is a distribution diagram of calibration magnetic field lines generated by a direct current calibration current in a calibration coil with a second structure.
Figure 17:
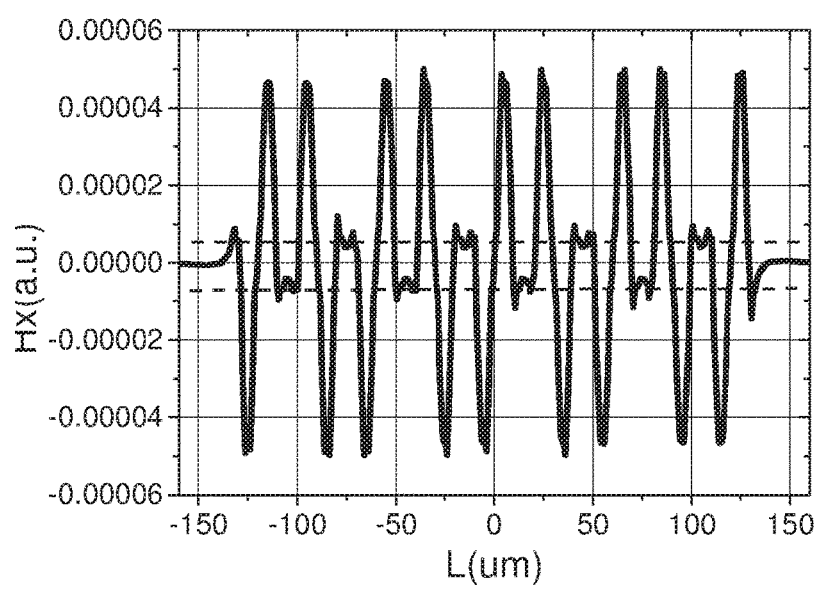
FIG. 17 is a distribution diagram of calibration magnetic field components of a calibration coil with a second structure at a magnetoresistive sensing unit string.

FIG. 16 is a distribution diagram of a magnetic field of the calibration coil 32 corresponding to FIG. 15 on the interdigitated Y-axis magnetoresistive sensor, from which it can be seen that closed magnetic coils are formed respectively between two push straight calibration sub-conductors connected in parallel and two pull straight calibration sub-conductors connected in parallel that correspond to the push straight calibration conductor 33 and the pull straight calibration conductor 34, and a distribution feature of antisymmetry is formed at a junction thereof. Distribution features of Hx-direction magnetic fields at the push magnetoresistive sensing unit string and the pull magnetoresistive sensing unit string are as shown in FIG. 17, from which it can be seen that the push magnetoresistive sensing unit string and the pull magnetoresistive sensing unit string have such distribution features of Hx magnetic fields as the same size and opposite directions, which are in line with the features of effects of a Y calibration magnetic field of the push-pull magnetoresistive bridge sensing unit.

Embodiment 6

Figure 18:
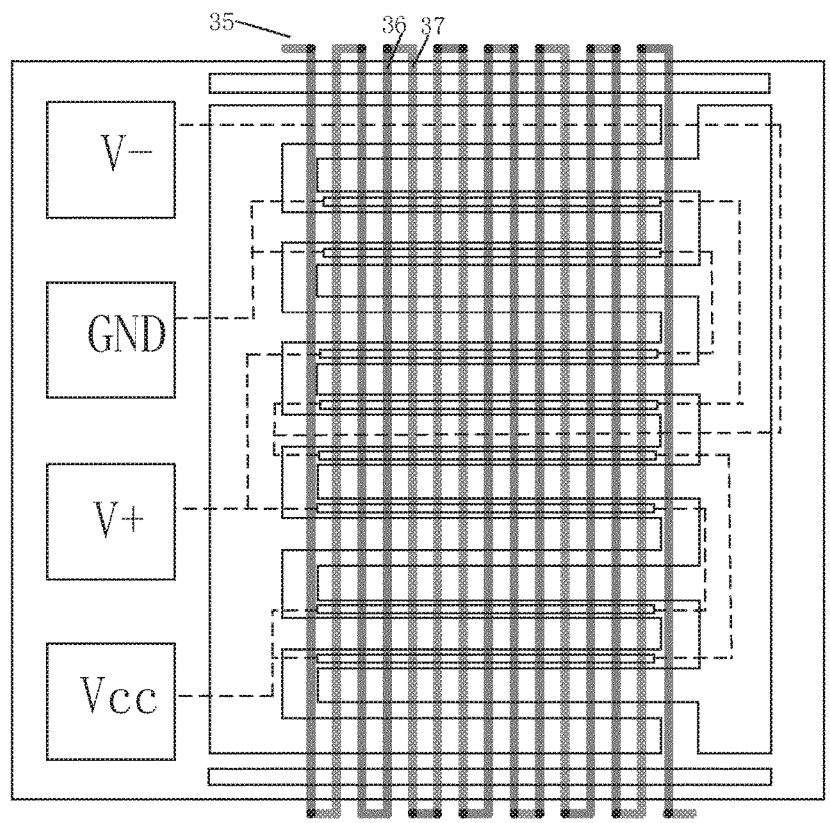
FIG. 18 is an electrical connection diagram of an interdigitated Y-axis magnetoresistive sensor including a planar initialization coil.

FIG. 18 is a structural diagram of a planar initialization coil 35 on an interdigitated Y-axis magnetoresistive sensor. The planar initialization coil includes parallel straight initialization conductors 36 that are perpendicular to the push magnetoresistive sensing unit string and the pull magnetoresistive sensing unit string. The straight initialization conductors are located directly above or directly below the push magnetoresistive sensing units and have the same current direction. The straight conductors 37 are located at gaps between two adjacent magnetoresistive sensing units, thus forming a serial structure.

Figure 19:
FIG. 19 is a distribution diagram of initialization magnetic field lines generated by an initialization direct current in a planar initialization coil.
Figure 20:
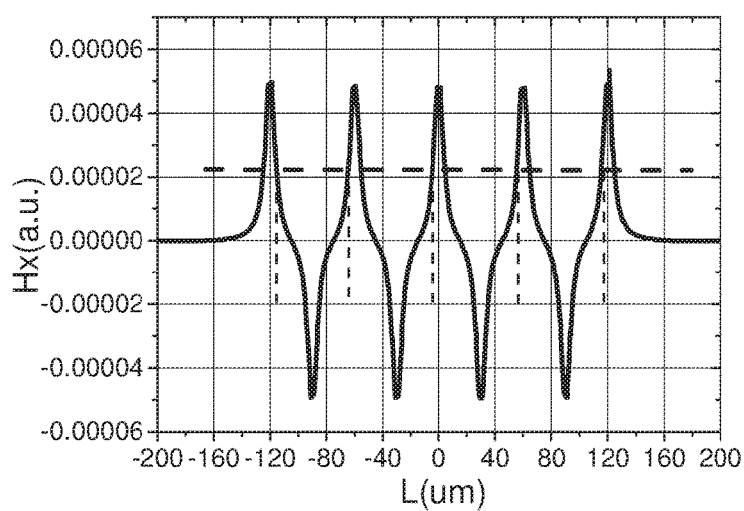
FIG. 20 is a distribution diagram of an initialization magnetic field of a planar initialization coil at a magnetoresistive sensing unit string.

FIG. 19 is a distribution diagram of a magnetic field of a planar initialization coil 35 on an interdigitated Y-axis magnetoresistive sensor, from which it can be seen that two adjacent straight conductors 36 and 37 have opposite magnetic field distribution features, and form two magnetic field line loops respectively. FIG. 20 shows distribution features of Hx magnetic fields located at the push magnetoresistive sensing unit string and the pull magnetoresistive sensing unit string, from which it can be seen that the push magnetoresistive sensing unit string and the pull magnetoresistive sensing unit string have the same Hx magnetic field component, and when the straight initialization conductors have the same distribution spacing, even if the push magnetoresistive sensing unit string and the pull magnetoresistive sensing unit string are not located directly above or directly below the straight initialization conductors, it can also be ensured that the push magnetoresistive sensing unit string and the pull magnetoresistive sensing unit string have the same Hx initialization magnetic field component.

Figure 21:
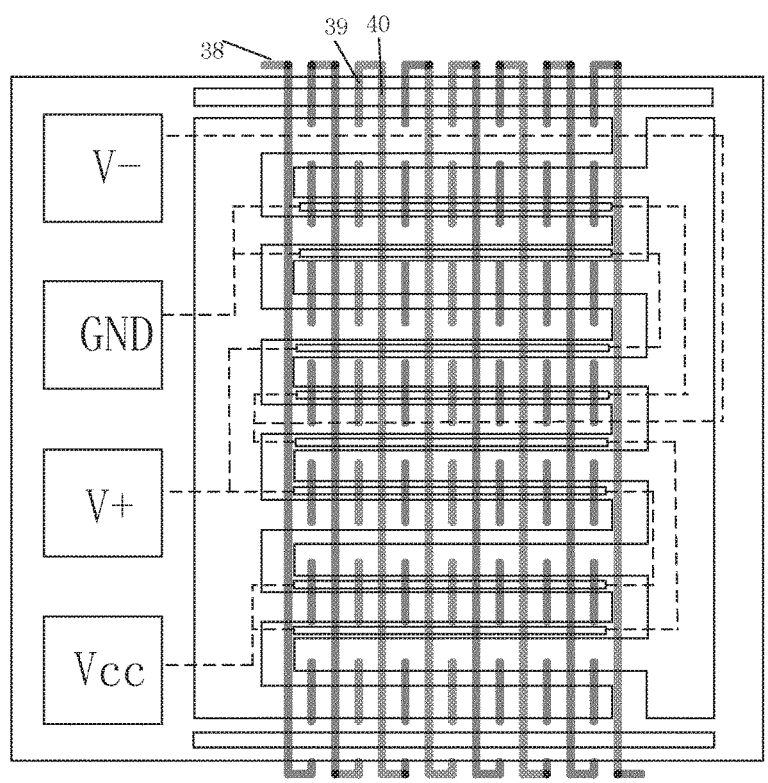
FIG. 21 is an electrical connection diagram of an interdigitated Y-axis magnetoresistive sensor including a three-dimensional initialization coil.

FIG. 21 is a structural distribution diagram of a three-dimensional initialization coil 38 on an interdigitated Y-axis magnetoresistive sensor, from which it can be seen that the three-dimensional initialization coil 38 includes parallel straight conductors 39 and 40 that are perpendicular to the push magnetoresistive sensing unit string and the pull magnetoresistive sensing unit string, which wind the magnetoresistive sensing unit strings and the soft ferromagnetic flux concentrators as magnetic cores to form a three-dimensional structure. The straight conductors 39 are located on lower surfaces of the soft ferromagnetic flux concentrators to form an equidistant arrangement structure, and the straight conductors 40 are located on upper surfaces of the soft ferromagnetic flux concentrators to form an equidistant arrangement structure. The straight conductors 39 are located on lower surfaces of the soft ferromagnetic flux concentrators to form an equidistant arrangement structure.

Figure 22:
FIG. 22 is a distribution diagram of initialization magnetic field lines generated by a direct current initialization current in a three-dimensional initialization coil.

FIG. 22 is a distribution diagram of a magnetic field of a three-dimensional straight initialization conductor 38 on an interdigitated Y-axis magnetoresistive sensor, from which it can be seen that upper straight initialization conductors 39 and lower straight initialization conductors 40 are distributed at the push magnetoresistive sensing unit string and the pull magnetoresistive sensing unit string to generate periodically distributed magnetic field line distribution features, and magnetic field line distribution directions of two adjacent straight conductors are opposite.

Figure 23:
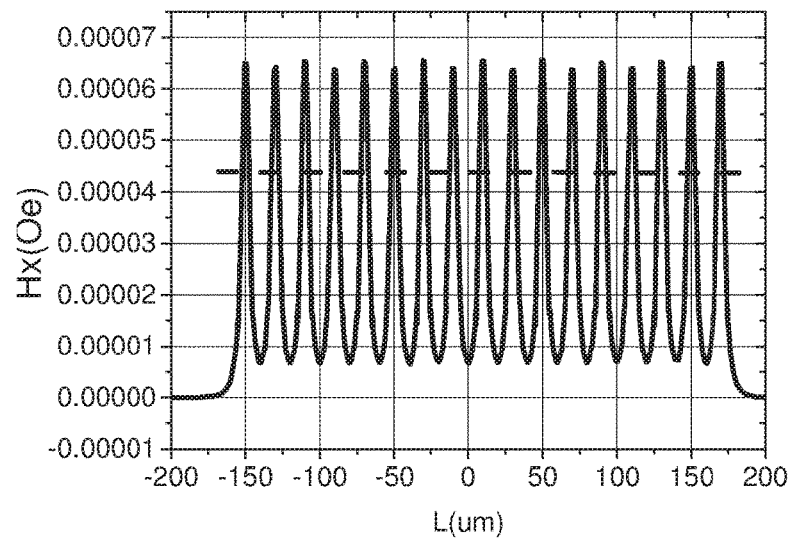
FIG. 23 is a distribution diagram of initialization magnetic field components of a three-dimensional initialization coil at a magnetoresistive sensing unit string.

FIG. 23 is a distribution curve of an Hx magnetic field generated by the three-dimensional straight initialization conductor 38 at the push magnetoresistive sensing unit and the pull magnetoresistive sensing unit of the interdigitated Y-axis magnetoresistive sensor, from which it can be seen that Hx magnetic field components generated by upper straight initialization conductors 39 and lower straight initialization conductors 40 at the push magnetoresistive sensing unit string and the pull magnetoresistive sensing unit have characteristics of periodic distribution. As long as the upper straight conductors and the lower straight conductors have a uniform periodic spacing, a uniform magnetic field distribution feature can be maintained no matter whether the straight conductors are located directly above or directly below the push magnetoresistive sensing unit or the pull magnetoresistive sensing unit, so that a uniform initialization magnetic field can be obtained.

Embodiment 7

Figure 24:
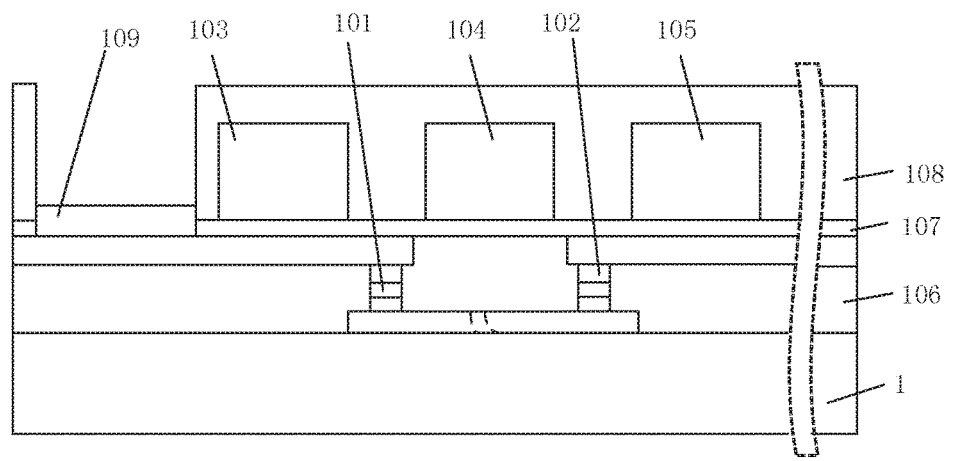
FIG. 24 is a sectional view of a basic structure of an interdigitated soft ferromagnetic Y-axis magnetoresistive sensor.

FIG. 24 is a sectional view of a basic structure of an interdigitated Y-axis magnetoresistive sensor, from which it can be seen that a push magnetoresistive sensing unit string 101 and a pull magnetoresistive sensing unit string 102 are located above the substrate 1, located at a first gap formed by a first comb-shaped soft ferromagnetic flux concentrator 103 and a second comb-shaped soft ferromagnetic flux concentrator 104, and a second gap formed by the second comb-shaped soft ferromagnetic flux concentrator 104 and a first comb-shaped soft ferromagnetic flux concentrator 105. 106 denotes an insulating layer between multiple thin films and electrode layers of the push magnetoresistive sensing unit 101 and the pull magnetoresistive sensing unit 102. 107 denotes an insulating layer between electrodes of the soft ferromagnetic flux concentrators and the magnetoresistive sensing units. 108 denotes a protective layer of the interdigitated Y-axis magnetoresistive sensor. 109 denotes an output/input electrode of the interdigitated Y-axis magnetoresistive sensor.

Figure 25:
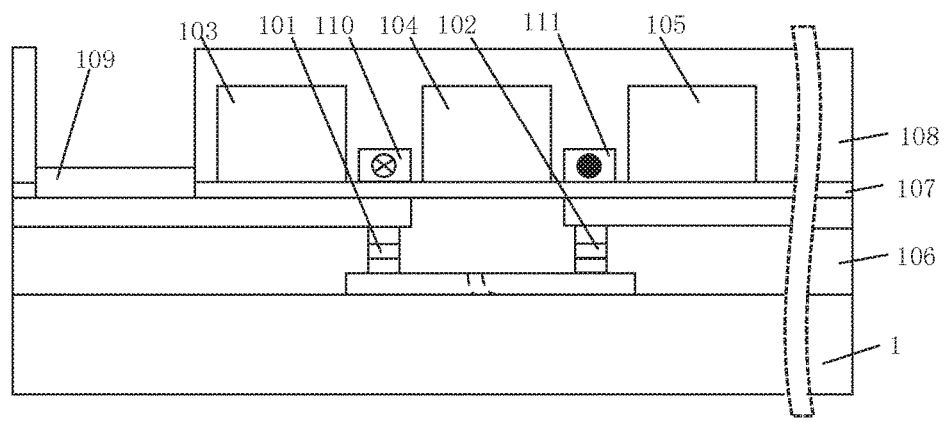
FIG. 25 is a sectional view of a basic structure of an interdigitated soft ferromagnetic Y-axis magnetoresistive sensor including a calibration coil with a first structure.

FIG. 25 is a sectional view of a basic structure of an interdigitated Y-axis magnetoresistive sensor including a calibration coil with a first structure, where 110 denotes a push straight calibration conductor, and 111 denotes a pull straight calibration conductor. The push and pull straight calibration conductors are located directly above or directly below the push magnetoresistive sensing unit string 101 and the pull magnetoresistive sensing unit string 102 respectively. In this figure, the push and pull straight calibration conductors are located directly above the push and pull magnetoresistive sensing unit strings. In fact, the push and pull straight calibration conductors may also be located above the substrate and below the magnetoresistive sensing units, or located in an area between the magnetoresistive sensing unit and the soft ferromagnetic flux concentrator, or located above the soft ferromagnetic flux concentrator.

Figure 26:
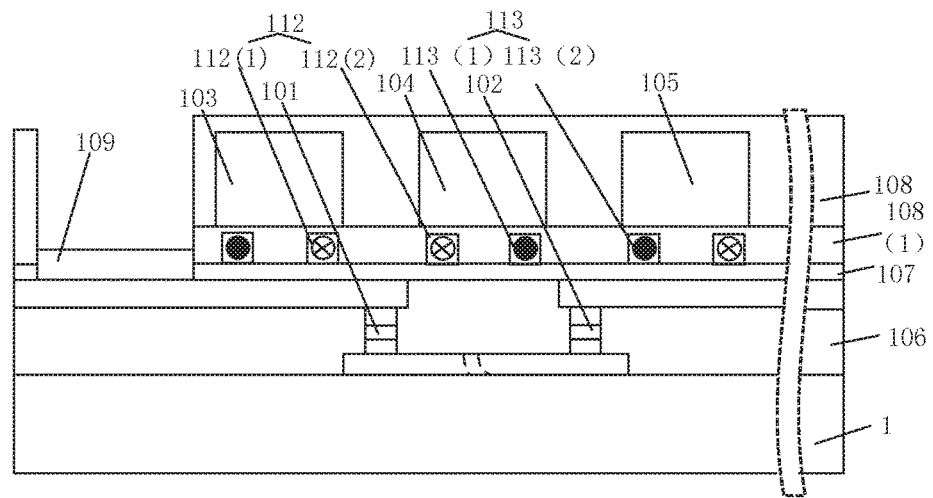
FIG. 26 is a sectional view of a basic structure of an interdigitated soft ferromagnetic Y-axis magnetoresistive sensor including a calibration coil with a second structure.

FIG. 26 is a sectional view of a basic structure of an interdigitated Y-axis magnetoresistive sensor including a calibration coil with a second structure, where 112 denotes a push straight calibration conductor, including two push straight sub-conductors 112(1) and 112(2) connected in parallel, and 113 denotes a pull straight calibration conductor, including two pull straight sub-conductors 113(1) and 113(2) connected in parallel. The two push straight sub-conductors 112(1) and 112(2) are symmetrically located on two sides of the push magnetoresistive sensing unit string 101, the two pull straight sub-conductors 113(1) and 113(2) are also symmetrically located on two sides of the pull magnetoresistive sensing unit string 102, and the distance from 113(1) and 113(2) to the pull magnetoresistive sensing unit string 102 is equal to the distance from 112(1) and 112(2) to the push magnetoresistive sensing unit string 101. In this structure, the straight calibration conductors with the second structure are located above the magnetoresistive sensing units and below the soft ferromagnetic flux guides, which, in fact, may also be located above the substrate, below the magnetoresistive sensing units, and above the soft ferromagnetic flux guides. The insulating layer 108(1) is used to ensure electrical insulation between the magnetoresistive sensing units and the soft ferromagnetic flux concentrators.

Figure 27:
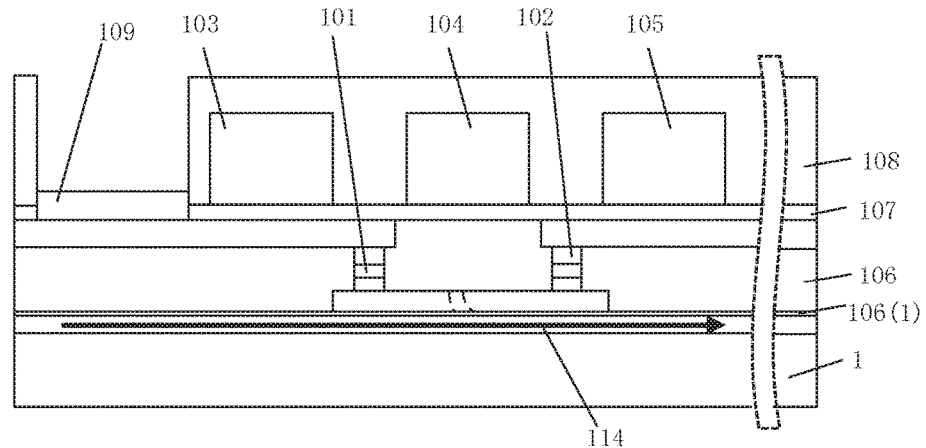
FIG. 27 is a sectional view of a basic structure of an interdigitated soft ferromagnetic Y-axis magnetoresistive sensor including a planar initialization coil.

FIG. 27 is a sectional view of a basic structure of an interdigitated Y-axis magnetoresistive sensor including a planar initialization coil. The initialization coil 114 includes straight conductors that are perpendicular to the push and pull magnetoresistive sensing unit strings 101 and 102, which are located above the substrate and below the magnetoresistive sensing units. The insulating layer 106(1) is used to ensure electrical insulation between the initialization coil 114 and the magnetoresistive sensing units 101 and 102. In fact, the initialization coil 114 may also be located between the magnetoresistive sensing unit and the soft ferromagnetic flux guide, or located above the soft ferromagnetic flux guide.

Figure 28:
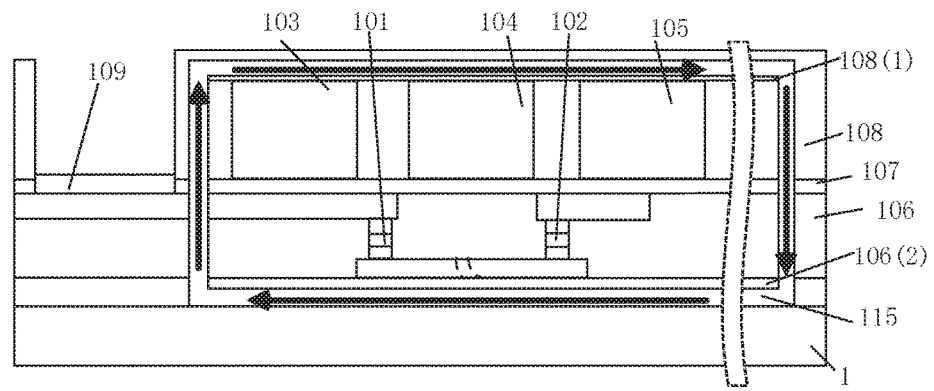
FIG. 28 is a sectional view of a basic structure of an interdigitated soft ferromagnetic Y-axis magnetoresistive sensor including a three-dimensional initialization coil.

FIG. 28 is a sectional view of an interdigitated Y-axis magnetoresistive sensor including a three-dimensional initialization coil. The three-dimensional initialization coil 115 includes straight conductors that are perpendicular to the push and pull magnetoresistive sensing unit strings 101 and 102, which wind around the magnetoresistive sensing units and the soft ferromagnetic flux guides respectively. 108(1) and 106(2) respectively denote insulating layers that ensure electrical insulation between the three-dimensional initialization coil 115 and the magnetoresistive sensing unit strings as well as the soft ferromagnetic flux concentrators.

Figure 29:
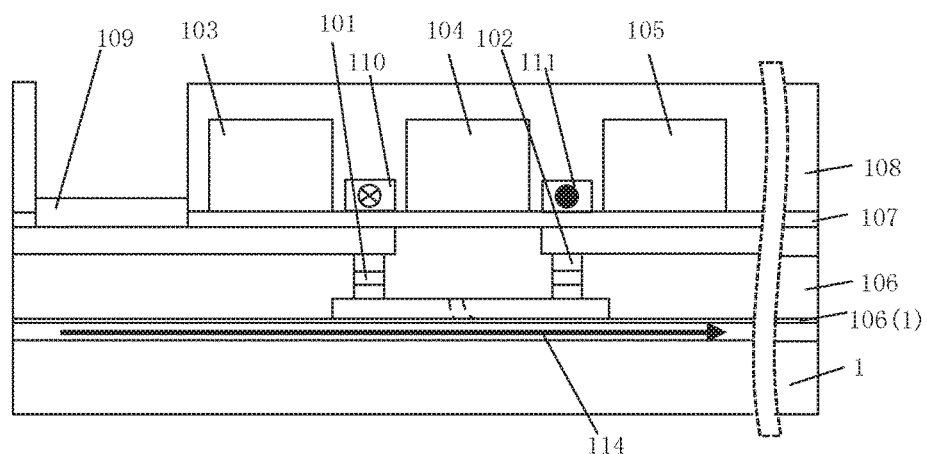
FIG. 29 is a sectional view of a basic structure of an interdigitated soft ferromagnetic Y-axis magnetoresistive sensor including an initialization coil and a calibration coil.

FIG. 29 is a sectional view of a basic structure of an interdigitated Y-axis magnetoresistive sensor including a calibration coil and an initialization coil. The calibration coil may be any type of that in FIG. 25 and FIG. 26, which may be located above the substrate and below the magnetoresistive sensing unit, located between the magnetoresistive sensing unit and the soft ferromagnetic flux guide, located above the soft ferromagnetic flux guide, or located between the first gap and the second gap. The initialization coil may also be any type of that in FIG. 27 and FIG. 28, where the planar initialization coil may be located above the substrate and below the magnetoresistive sensing unit, located above the magnetoresistive sensing unit and below the soft ferromagnetic flux guide, or located above the soft ferromagnetic flux guide. The three-dimensional initialization coil winds around the magnetoresistive sensing unit and the soft ferromagnetic flux guide. This figure merely shows one situation where a calibration coil of a first type is included, which is located between a first gap and a second gap, and the initialization coil is located above the substrate and in an area between the soft ferromagnetic flux guides.

In addition, the initialization current may be a pulse current or a direct current.

The initialization coil and the calibration coil are made of a high-conductivity material, such as Cu, Au, Ag, or Al.

The soft ferromagnetic flux concentrator is made of an alloy soft ferromagnetic material that includes one or more elements of Fe, Ni, Co, and the like.

The material of the substrate is glass or a silicon wafer, and the substrate includes an ASIC or the substrate is connected to another ASIC chip.

The initialization coil and/or the calibration coil are/is isolated from the first comb-shaped soft ferromagnetic flux guide, the second comb-shaped soft ferromagnetic flux guide, and the push-pull magnetoresistive bridge sensing unit by using an insulating material, and the insulating material is SiO2, Al2O3, Si3N4, polyimide or photoresist.

The above description is merely preferred embodiments of the present invention, and is not intended to limit the present invention. For those skilled in the art, various modifications and changes can be made to the present invention. Implementations in the present invention may also be combined and changed differently. Any modification, equivalent replacement, improvement and the like made within the spirit and principle of the present invention should all fall within the protection scope of the present invention.

The invention claimed is:

1. An interdigitated Y-axis magnetoresistive sensor, comprising:
   a substrate, and a first comb-shaped soft ferromagnetic flux guide,
   a second comb-shaped soft ferromagnetic flux guide, and
   a push-pull magnetoresistive bridge sensing unit located on the substrate;
   wherein a first comb tooth and a first comb base of the first comb-shaped soft ferromagnetic flux guide and a second comb tooth and a second comb base of the second comb-shaped soft ferromagnetic flux guide are all rectangular, major axes and minor axes of the first comb tooth and the second comb tooth are parallel to the Y axis and the X axis, respectively, and major axes and minor axes of the first comb base and the second comb base are parallel to the X axis and the Y axis, respectively;

wherein the first comb-shaped soft ferromagnetic flux guide and the second comb-shaped soft ferromagnetic flux guide are formed into an interdigitated structure, a first gap and a second gap are alternately formed in sequence between the first comb tooth and the second comb tooth which are adjacent, and gaps are also formed between the second comb tooth and the first comb base as well as between the first comb tooth and the second comb base; and wherein the push-pull magnetoresistive bridge sensing unit comprises push and pull magnetoresistive sensing unit strings, the push and pull magnetoresistive sensing unit strings both comprise multiple magnetoresistive sensing units connected together, are parallel to the Y-axis, and are alternately placed in the first gap and the second gap, the push and pull magnetoresistive sensing unit strings are electrically connected to form a push arm and a pull arm, respectively, the push arm and the pull arm comprise the same number of the magnetoresistive sensing unit strings, the push arm and the pull arm are electrically connected to form the push-pull magnetoresistive bridge sensing unit, and the magnetoresistive sensing unit senses the magnetic field along the X-axis.

2. The interdigitated Y-axis magnetoresistive sensor according to claim 1, further comprising a calibration coil, wherein the calibration coil comprises straight calibration conductors that are parallel to the push and pull magnetoresistive sensing unit strings, and when a calibration current flows through the calibration coil, calibration magnetic field components having the same amplitude along X and –X directions are generated at the push and pull magnetoresistive sensing unit strings, respectively.

3. The interdigitated Y-axis magnetoresistive sensor according to claim 2, wherein the calibration coil comprises a push straight calibration conductor and a pull straight calibration conductor, a position relation between the push straight calibration conductor and the corresponding push magnetoresistive sensing unit string is the same as that between the pull straight calibration conductor and the corresponding pull magnetoresistive sensing unit string, the position relation is that the straight calibration conductor is located directly above or directly below the corresponding magnetoresistive sensing unit string, and the push straight calibration conductor and the pull straight calibration conductor are connected in series and have opposite current directions.

4. The interdigitated Y-axis magnetoresistive sensor according to claim 3, wherein the calibration coil comprises a positive port and a negative port, and when a current flows through the two ports, an amplitude range of a calibration magnetic field generated thereby is within a linear working area of the magnetoresistive sensing unit.

5. The interdigitated Y-axis magnetoresistive sensor according to claim 4, wherein the calibration current can be set to one current value or multiple current values.

6. The interdigitated Y-axis magnetoresistive sensor according to claim 2, wherein the calibration coil comprises a push straight calibration conductor and a pull straight calibration conductor, the push straight calibration conductor and the pull straight calibration conductor both comprise two parallel straight calibration conductors connected in parallel, the two push straight calibration conductors and the two pull straight calibration conductors have the same spacing and are symmetrically distributed on two sides of the push and pull magnetoresistive sensing unit strings, respectively, and the push straight calibration conductors and the pull straight calibration conductors are connected in series and have opposite current directions.

7. The interdigitated Y-axis magnetoresistive sensor according to claim 2, wherein the calibration coil is made of a high-conductivity material, and the high-conductivity material is Cu, Au, Ag, or Al.

8. The interdigitated Y-axis magnetoresistive sensor according to claim 2, wherein the calibration coil is located above the substrate and below the magnetoresistive sensing unit, or between the magnetoresistive sensing unit and the soft ferromagnetic flux guide, or above the soft ferromagnetic flux guide.

9. The interdigitated Y-axis magnetoresistive sensor according to claim 2, wherein the calibration coil is isolated from the first comb-shaped soft ferromagnetic flux guide, the second comb-shaped soft ferromagnetic flux guide, and the push-pull magnetoresistive bridge sensing unit by using an insulating material, and the insulating material is SiO2, Al2O3, Si3N4, polyimide or photoresist.

10. The interdigitated Y-axis magnetoresistive sensor according to claim 1, wherein all the first comb teeth are of the same size, all the second comb teeth are of the same size, all the first gaps are of the same size, all the second gaps are of the same size, and the sizes of the first gaps and the second gaps are the same.

11. The interdigitated Y-axis magnetoresistive sensor according to claim 1, wherein the magnetoresistive sensing units are GMR spin valves or TMR sensing units, and wherein the directions of pinning layers are parallel to the Y-axis, and the directions of free layers are parallel to the X-axis.

12. The interdigitated Y-axis magnetoresistive sensor according to claim 11, wherein in the absence of an external magnetic field, the magnetoresistive sensing units make magnetization directions of magnetic free layers perpendicular to magnetization directions of magnetic pinning layers by permanent magnet biasing, double exchange interaction, shape anisotropy or any combination thereof.

13. The interdigitated Y-axis magnetoresistive sensor according to claim 1, wherein the push-pull magnetoresistive bridge sensing unit is a half bridge, a full bridge, or a quasi bridge.

14. The interdigitated Y-axis magnetoresistive sensor according to claim 1, wherein when the number of the first comb teeth is 2*N+1, N being an integer greater than 1, the push magnetoresistive sensing unit string and the pull magnetoresistive sensing unit string are alternately distributed in 2*N first gaps and second gaps.

15. The interdigitated Y-axis magnetoresistive sensor according to claim 14, wherein any of the push magnetoresistive sensing unit string has a pull magnetoresistive sensing unit string symmetric therewith relative to the X-axis centerline of the first comb-shaped soft ferromagnetic flux concentrator.

16. The interdigitated Y-axis magnetoresistive sensor according to claim 1,
wherein when the number of the first comb teeth is 2*N+2, N being an integer greater than 1, the push magnetoresistive sensing unit string and the pull magnetoresistive sensing unit string are alternately distributed in 2*N first gaps and second gaps except the first gap and the second gap which are located in the middle.

17. The interdigitated Y-axis magnetoresistive sensor according to claim 1,
wherein when the number of the first comb teeth is 2, the push magnetoresistive sensing unit string and the pull magnetoresistive sensing unit string are alternately distributed in the first gap and the second gap.

18. The interdigitated Y-axis magnetoresistive sensor according to claim 1,
wherein with the increase of a ratio of the sum of the width of the first comb tooth and the width of the second comb tooth with respect to the widths of the first gap and the second gap, the gain of the push-pull magnetoresistive bridge sensing unit is increased.

19. The interdigitated Y-axis magnetoresistive sensor according to claim 1,
wherein X ends and −X ends of the first comb base and the second comb base are all aligned.

20. The interdigitated Y-axis magnetoresistive sensor according to claim 19,
wherein the Y-axis magnetoresistive sensor further comprises two identical soft ferromagnetic flux concentrator bars, and the two soft ferromagnetic flux concentrator bars are located at an X end and a −X end of the first comb-shaped soft ferromagnetic flux concentrator and the second comb-shaped soft ferromagnetic flux concentrator respectively and are at the same distance from the two ends.

21. The interdigitated Y-axis magnetoresistive sensor according to claim 1,
wherein the soft ferromagnetic flux concentrator is made of an alloy soft ferromagnetic material that comprises one or more elements of Fe, Ni, and Co.

22. The interdigitated Y-axis magnetoresistive sensor according to claim 1,
wherein the material of the substrate is glass or a silicon wafer, and the substrate comprises an ASIC or the substrate is connected to another ASIC chip.

23. The interdigitated Y-axis magnetoresistive sensor according to claim 1, further comprising an initialization coil,
wherein the initialization coil comprises straight initialization conductors that are perpendicular to the push and pull magnetoresistive sensing unit strings, and when an initialization current flows into the initialization coil, magnetic field components having the same amplitude along a Y direction or a −Y direction are generated at all the magnetoresistive sensing units.

24. The interdigitated Y-axis magnetoresistive sensor according to claim 23,
wherein the initialization coil is a planar coil, and the straight initialization conductors comprised therein are perpendicular to the push magnetoresistive sensing unit string and the pull magnetoresistive sensing unit string, are located directly above or directly below each magnetoresistive sensing unit, and have identical current directions.

25. The interdigitated Y-axis magnetoresistive sensor according to claim 24,
wherein the initialization coil comprises two ports, and when a current flows through the two ports, the magnitude of an initialization magnetic field generated thereby is higher than a saturated magnetic field value of the magnetoresistive sensing unit.

26. The interdigitated Y-axis magnetoresistive sensor according to claim 25,
wherein the initialization current is a pulse current or a direct current.

27. The interdigitated Y-axis magnetoresistive sensor according to claim 23,
wherein the initialization coil is a three-dimensional coil, the three-dimensional coil winds the first comb-shaped soft ferromagnetic flux guide, the second comb-shaped soft ferromagnetic flux guide and the magnetoresistive sensing unit, the straight initialization conductors are located on the surfaces of the soft ferromagnetic flux guides and the magnetoresistive sensing unit, respectively, and the straight initialization conductors have the same arrangement interval on the surfaces.

28. The interdigitated Y-axis magnetoresistive sensor according to claim 23,
wherein the initialization coil is made of a high-conductivity material, and the high-conductivity material is Cu, Au, Ag, or Al.

29. The interdigitated Y-axis magnetoresistive sensor according to claim 23,
wherein the initialization coil is located above the substrate and below the magnetoresistive sensing unit, or between the magnetoresistive sensing unit and the soft ferromagnetic flux guide, or above the soft ferromagnetic flux guide.

30. The interdigitated Y-axis magnetoresistive sensor according to claim 23,
wherein the initialization coil-is isolated from the first comb-shaped soft ferromagnetic flux guide, the second comb-shaped soft ferromagnetic flux guide, and the push-pull magnetoresistive bridge sensing unit by using an insulating material, and the insulating material is $SiO_2$, $Al_2O_3$, $Si_3N_4$, polyimide or photoresist.

* * * * *